United States Patent [19]

Lu et al.

[11] Patent Number: 4,944,961
[45] Date of Patent: Jul. 31, 1990

[54] DEPOSITION OF METALS ON STEPPED SURFACES

[75] Inventors: Toh-Ming Lu, Latham; Shao-Ning Mei, Wappingers Falls, both of N.Y.

[73] Assignee: Rensselaer Polytechnic Institute, Troy, N.Y.

[21] Appl. No.: 228,985

[22] Filed: Aug. 5, 1988

[51] Int. Cl.$^5$ .............................................. B05D 3/06
[52] U.S. Cl. ........................................ 427/38; 427/35; 427/42; 427/250; 427/256; 427/314
[58] Field of Search ...................... 427/38, 35, 42, 250, 427/256, 314

[56] References Cited

U.S. PATENT DOCUMENTS

| 4,480,010 | 10/1984 | Sasanuma et al. | 428/457 |
| 4,500,564 | 2/1985 | Enomoto | 427/39 |
| 4,559,901 | 12/1985 | Morimoto et al. | 427/38 X |
| 4,564,997 | 1/1986 | Matsuo et al. | 29/576 W |
| 4,566,940 | 1/1986 | Hsumi et al. | 156/643 |
| 4,659,427 | 4/1987 | Barry et al. | 156/643 |
| 4,661,228 | 4/1987 | Mintz | 204/192.25 |
| 4,664,935 | 5/1987 | Strahl | 427/38 |
| 4,690,746 | 9/1987 | McInerney et al. | 204/192.32 |

OTHER PUBLICATIONS

Ramayarananan et al., "Undirectional Deposition of Aluminum Using Nozzle Jet Beam Technique", J. Vac. Sci. Technol. B, 5(1), pp. 359–362, 1987.

Yamada et al., "Vaporized-Metal Cluster Formation and Ionized-Cluster Beam Deposition and Epitaxy", Thin Solid Films, 80, pp. 105–115 (1981).

Yamada et al., "Ionized Clusters: A Technique for Low Energy Ion Beam Deposition" SPIE's Los Angeles Technical Symposium an Optical Electro-Optical Engineering (1985).

Yamada, "A Review of Ionized Cluster Beam Technology", Proc. Int'l. Ion Engineering Congress—ISIAT '83=1 'Pat' 83, Kyoto (1983), pp. 1177092.

Primary Examiner—Bernard Pianalto
Attorney, Agent, or Firm—Heslin & Rothenberg

[57] ABSTRACT

A high ionization efficiency process for partially ionized beam deposition of metals or metal alloys on substrates such as semiconductor wafers is described. Metal vaporized from a crucible is partially ionized at the crucible exit, and the ionized vapor is drawn to the substrate by an imposed bias. Control of substrate temperature allows non-conformal coverage of stepped surfaces such as vias or trenches. When higher substrate temperatures are used, stepped surfaces are planarized.

16 Claims, 10 Drawing Sheets fig. 1
PRIOR ART fig. 2
PRIOR ART fig. 3 fig. 4 fig. 5 fig. 6 fig. 7

DEPOSITION OF METALS ON STEPPED SURFACES

This invention relates to improvements in the coating of substrates with metal films, and more particularly to apparatus and methods for depositing thin metallic films on substrates having stepped surfaces, such as steps, vias, and trenches on semiconductor wafers, and if desired, then planarizing the surface.

BACKGROUND OF THE INVENTION

The submicron technology used for semiconductor device fabrication often results in the speed of a very large scale integrated (VLSI) chip being more likely to be limited by delays due to interconnects rather than the transistor action of the devices. Multilevel metallization is one of the available technologies used to reduce the total length of interconnects. In multilevel metallization, different layers of patterned conductors are isolated from each other by insulators, and contacts are made between conductors on different layers through holes in the insulator, commonly called vias. To reduce capacitance between conductor layers, a relatively thick insulator layer is desirable. High packing density design requires however that the via dimension be small. These circumstances mean that in multilevel metallization there is a need to fill high aspect ratio vias with high conductivity metals such as aluminum to form reliable contacts. In addition, interconnections between individual functions on the same level are often required. These interconnections may be supplied by filling elongated runs or trenches in the insulator layer with a metal such as aluminum. When conventional evaporative methods are used to fill vias and trenches, the metal vapor tends to deposit on the sidewalls of the step as well as the bottom, i.e. conformally. The metal also tends to build up at the top edge of the step to form an overhang leading to what is called the shadowing effect. This shadowing effect prevents the metal from depositing in the step corner where the vertical sidewall meets the bottom of the step. In vias and trenches which are about as deep or even deeper than they are wide (high aspect ratio), extreme shadowing effects may lead to the overhangs from each side approaching or even meeting each other, thus tending to block the trench or via from being filled from wall to wall. In any case, coverage of conventionally evaporated aluminum films in step corners and at the sidewall of vias and trenches is poor. This may lead to severe reliability problems in VLSI chips which have had interconnections formed by this method. Several techniques, such as biased sputtering, pulsed laser irradiation, selective tungsten chemical vapor deposition, and electroless plating methods have been used in efforts to overcome this problem. In addition to higher processing costs, these techniques usually yield films with poor conductivity or excessive defect density.

It is known that ion bombardment during film growth can modify the film composition, structure and other properties. Many ion-assisted deposition techniques involve foreign elements such as Ar+ as the source of ions to control film properties during deposition. Recently a number of experimentalists have employed self-ions which are derived from the deposition material itself as the source of ions to control film structure and the resulting properties. There has been some success in employing self-ions for low temperature epitaxy, high efficiency dopant incorporation and control of stoichiometry of films. Ramayarananan et al. in *J. Vac. Sci. Technol. B*, Vol. 5, 359–362 (1987) have described the use of a nozzle jet beam or ionized cluster beam method in filling vias. This process coats the substrate non-conformally, i.e. little or no sidewall coverage occurs. Shadowing still occurs however, as shown in FIG. 1 of that reference. Vias and trenches are not filled wall-to-wall from bottom to top, as shown by the tapered shape of the aluminum plugs in FIG. 4(a) of the reference. This is borne out also by the computer simulation results shown in FIG. 6 of Ramayarananan et al.. In FIG. 5 of that publication, the effect of the simultaneous use of a combination of simple evaporation and nozzle jet beam techniques is shown to result in sidewall coverage from the evaporation process ("flags") combined with the tapered shape from the jet beam.

Figure 2:
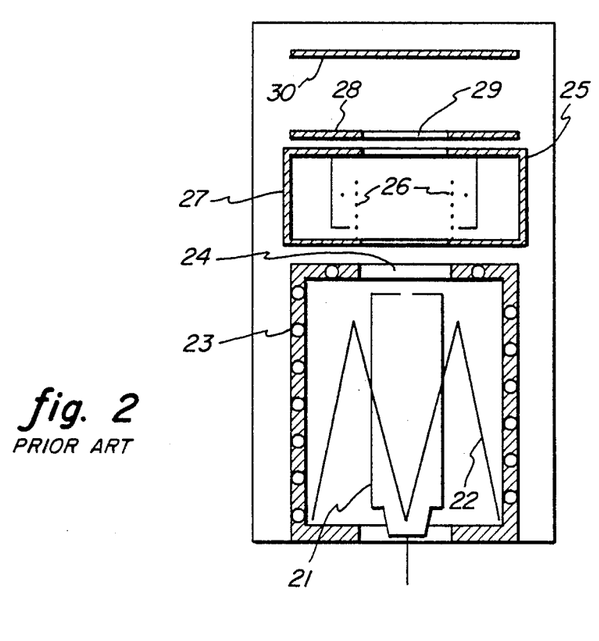
FIG. 2 schematically depicts a typical apparatus employed in a nozzle jet beam process of the prior art.

These techniques using self-ions have been called Partially Ionized Beam Deposition (PIBD). Unlike the ionization source for efficient dopant incorporation which is a point source which yields a high-energy beam composed of 100% ions, PIBD techniques have used small amounts of ions during deposition. The ion-/atom ratio, or ionization efficiency, $\alpha$, of the beam is normally less than 0.2%. As shown in FIG. 2 of this application, in the conventional design the ionization unit of the PIBD system is located outside the vaporization chamber, a few cm away from the evaporation crucible. It has been determined that under typical operating conditions the ionization efficiency of this design is quite low (less than 0.2% ion/atom ratio). To enhance the ion-assisted deposition effect, a higher ionization efficiency is desirable.

SUMMARY OF THE INVENTION

The invention provides a method for filling high aspect ratio vias or trenches wall-to-wall with metal to afford the electrical contacts and conductivity required for VLSI chips, by means of an apparatus which provides an ion beam of partially ionized metal vapor having an ion/atom ratio from about 0.7% to about 5% and then directing the ion beam onto a substrate to which a bias potential has been applied.

The invention provides a method for non-conformally coating a stepped surface of a substrate with a metal film.

The invention also provides a method for planarizing a stepped surface suitable for further processing.

DETAILED DESCRIPTION OF THE INVENTION

Partially Ionized Beam Source and Apparatus

The present invention provides a new ionization source which is capable of handling high temperature source material and provides a high deposition rate as well as a relatively high ionization efficiency. The ionization efficiency and uniformity of the ion-current at the substrate have been determined using aluminum as the source material. The ionization characteristics of the source of this invention are compared to those of a conventional ionization source design such as the EATON ICB-100 system.

The apparatus usually used in processes for evaporating a metal or metal alloy to form a metallic film on a substrate such as a semi-conductor wafer, including the present invention, is enclosed in a chamber which can be inerted and evacuated to a system pressure low enough to allow a metal or metal alloy to evaporate at a temperature substantially lower than its boiling point at atmospheric pressure. Typically this apparatus may be evacuated to pressures of about $10^{-4}$ to $10^{-7}$ Torr (about $10^{-2}$ to $10^{-5}$ Pa) or less. The size of this chamber will vary from one apparatus to another, but the size of the chamber is not critical so long as there is sufficient room in the chamber for the deposition apparatus. The size also necessarily establishes a maximum distance that can exist between the source and substrate. This distance between source and substrate is not critical, but it does limit the area of substrate which can be covered. For the illustrative apparatus described herein, the maximum possible source to substrate distance was about 30 cm. Greater or lesser source to substrate distances may be employed without departing from the scope of the invention.

Figure 1:
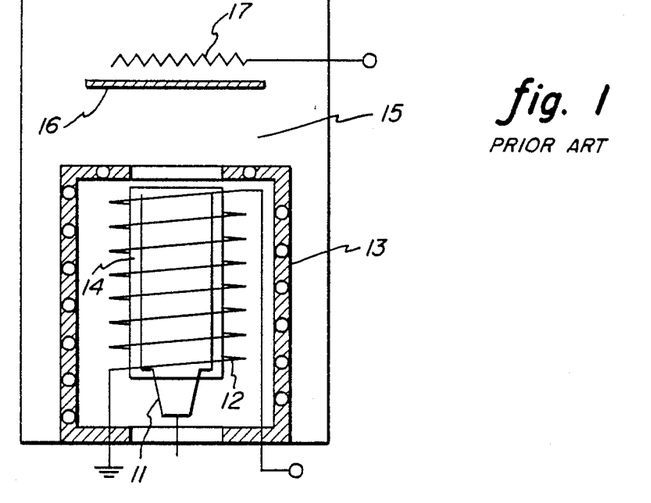
FIG. 1 schematically depicts an apparatus employed in a conventional evaporation process.

FIG. 1 schematically depicts a typical apparatus employed in a conventional evaporation process of the prior art, which has been modified for the purpose of comparison with the present invention. An open-topped crucible 11 containing a metal or metal alloy such as aluminum is heated by a resistance heater 12 wound on an alumina core 14 or similar means. The apparatus is surrounded by a cooling jacket 13, usually water cooled, which is open at the top to allow vapor of the metal or metal alloy to escape into the main chamber 15 of the deposition apparatus. Above the crucible at a distance of from about 10 cm to about 30 cm or more is a substrate 16. For comparison with the present invention, the apparatus was also provided with means for applying a bias potential (not shown). Also for comparison with the present invention, a variable heat source 17 was placed behind the substrate to heat the substrate. The heater was a low-powered resistance heater.

FIG. 2 schematically depicts a typical apparatus employed in a nozzle jet beam or ionized cluster beam process of the prior art. A crucible 21 having a nozzle cap (47 in FIG. 4a) is heated by a resistance heater 22 or similar means. The crucible and heater are surrounded by a cooling jacket 23 as in the evaporation process apparatus. Above the outlet 24 of this evaporation chamber is an ionization unit 25, conveniently including a refractory metal wire grid 26, which is bombarded with electrons from an electron bombardment filament 27 which surrounds the grid. Above the ionization unit is an acceleration electrode 28, with an aperture 29 in the center. Above the crucible at a distance of from about 10 cm to about 30 cm or more is a substrate 30. A potential or bias is supplied to the substrate by a power source (not shown).

Figure 4:
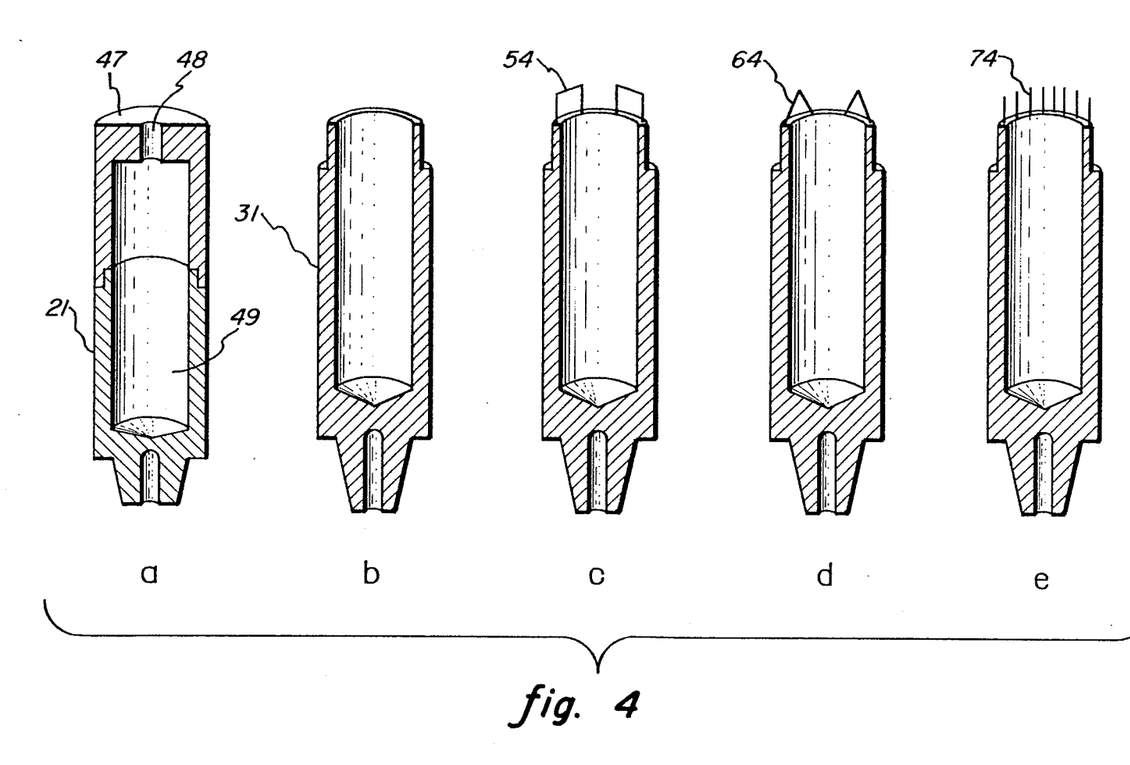
FIG. 4a schematically depicts in cross-section, a crucible employed in a nozzle jet beam process.
FIG. 4b schematically depicts in cross-section, a crucible employed in the process of the present invention.
FIG. 4c schematically depicts in cross-section, a crucible with U-shaped ionization grids.
FIG. 4d schematically depicts in cross-section, a crucible with V-shaped ionization grids.
FIG. 4e schematically depicts in cross-section, a crucible with ionization grids formed of short lengths of straight wire.

Turning to FIG. 4a, the crucible 21 used in the nozzle jet beam process is shown in a cross-sectional detail. The nozzle 48 in the cap 47 at the top of the crucible has a relatively small diameter, generally not much larger than 2 mm in order to create a substantial pressure drop between the inside 49 of the crucible and the external environment. When the nozzle is larger than about 2 mm, little or no pressure drop is observed.

Figure 3:
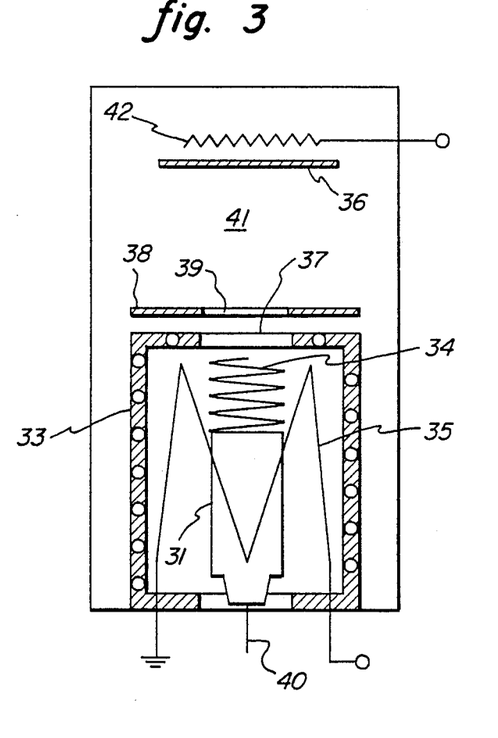
FIG. 3 schematically depicts an apparatus according to the present invention.

FIG. 3 schematically depicts an apparatus according to the present invention which provides a greater ion/atom ratio than heretofore has been available. An open-topped crucible 31 made of a refractory material such as alumina, corundum, or the like, preferably graphite, and most preferably high purity graphite, contains a metal or metal alloy which is to be deposited on the substrate 36. (A more detailed diagram of the crucible is shown in FIG. 4b.) As shown in FIG. 3, an ionization grid 34 rests on or is attached to the top of the crucible 31. The grid is generally fabricated of a wire made of a refractory metal such as tantalum, molybdenum and the like, preferably of tungsten. Means are provided for causing a flux of electrons in the vicinity of the grid such as an electron bombardment filament.

In the preferred form of the invention shown in FIG. 3, a common electron bombardment filament 35 is used to heat the crucible and supply the electron flux. The common electron bombardment heating filament serves two purposes. It provides an electron bombardment current for heating of the crucible, and at the same time provides the electrons for ionizing the vapor beam. This arrangement enables the vapor beam to be ionized most efficiently since ionization occurs at the mouth of the crucible, the region where the atomic density of the vapor is at its maximum. By the proper combination of bombardment voltage and current, the crucible temperature and the ion-to-atom ratio can be controlled independently within certain limits. This is because the crucible temperature depends on the total input power, while the ion-to-atom ratio is mainly affected by the electron current. In this preferred form of the invention the crucible 31 is made of a conductive material such as graphite, and the grid 34 and crucible 31 function as anodes to the cathode of the common electron bombardment filament 35 by means of a circuit established through the crucible support 40 or similar means. When a separate means such as radiation, induction, or resistance heating is used to heat the crucible 31, or if the crucible is non-conductive it is necessary to supply independent circuit means to the grid 34 to enable the grid to function as an anode.

Although the ionization grid 34 shown in FIG. 3 and used for the experiments described herein was a helix of tungsten wire, it has been found that using multiple removable grids attached to the top of the graphite crucible is particularly convenient. Removable grids may for example be in any of a variety of shapes such as the form of an inverted U 54, or V 64 or short lengths of straight wire 74 as shown in FIGS. 4c, 4d, and 4e respectively. Other grid forms may also be used without departing from the invention. The shape of the grid is not critical. When multiple removable grids are used, the electron flux in the vicinity of the grid may be varied readily by changing the number of grids employed. Removal of some of the grids decreases the electron flux, adding grids increases the electron flux. The use of removable grids thus allows more independent control of crucible heating and/or electron flux when a common electron bombardment filament is used.

The above apparatus is surrounded by a cooling jacket 33, usually water cooled, which has an opening or outlet 37 in its top which is sufficiently larger than the diameter of the crucible to allow a partially ionized beam of the metal or metal alloy vapor to flow into the chamber 41 without interference. Above the outlet 37 and in substantial alignment with the outlet and top of the crucible, a round electrode 38 with an aperture 39 in the center is placed. The aperture 39 has a diameter larger than the diameter of the crucible 31. A bias potential on this electrode 38, called an extraction electrode herein, in conjunction with a bias potential on the substrate 36 forms ion optics which control the uniformity of the ion current of the partially ionized beam across the substrate surface.

The substrate 36 is placed with the surface to be coated set substantially perpendicular to the beam and substantially in alignment with the top of the crucible and the aperture of the extraction electrode. A power source (not shown) supplies a bias potential to the substrate 36. A variable heat source 42 such as a resistance heater placed behind the substrate is used to supply heat to the substrate during deposition of a film.

The interior dimensions of the graphite crucible are not critical; the crucible used in the experiments described herein was 10 mm in diameter and 25 mm in length to give a volume of about 5 cm$^3$.

The ionization grid was formed by wrapping a tungsten wire in the shape of a helix around a stainless steel rod with a diameter slightly smaller than the outer diameter of the crucible. After the tungsten wire was released from the stainless steel rod, the coil expanded just enough to fit the outside diameter of the crucible. The polygon shaped heating filament surrounding the crucible was also made of tungsten wire. The diameter of the wire is not critical, the wire used was 0.38 mm in diameter.

The separation between the filament and the crucible is an important factor in determining the uniformity of the crucible temperature, and was carefully adjusted to 4±0.5 mm. The distance employed is not critical, but it is desirable to heat the crucible uniformly. The test crucible was capable of operating at temperatures of up to about 1600° C. to provide a desired deposition rate of 1 to 50 Å/sec or more. In order to maintain the system pressure at about $3\times10^{-7}$ Torr (or $4\times10^{-5}$ Pa) during the deposition, the water cooling system was found to be essential. The round shaped extraction electrode 38 used was made of stainless steel with a 20 mm diameter aperture in the center and was mounted 10mm above the crucible. The placement and dimensions of the electrode 38 are not critical. However, the electrode should be within a few mm of the opening 37 and the aperture 39 should be large enough not to interfere with the partially ionized vapor beam. The material used to form the electrode is not critical so long as it is a metal which can accept a bias potential and is substantially non-reactive to the vapor beam.

Testing and Comparison of the Apparatus

Testing of the source and comparison with the apparatus of the prior art was carried out in a conventional diffusion-pumped vacuum system. The system pressure was maintained at less than $3\times10^{31\ 7}$ Torr ($4\times10^{31\ 5}$ Pa) during operation. The crucible Was heated by electron bombardment and the temperature of the crucible was cOntrOlled by the bombardment power supplied through the bombardment filament.

$$P_{cru}=V_{cru}\times I_{cru}$$

Where $P_{cru}$ is the power supplied to the crucible, $V_{cru}$ is the voltage applied to the crucible, and $I_{cru}$ is the cru current measured at the crucible. The bombardment current was found to be controlled solely by the filament current (filament temperature) in an emission limited mode or by the bombardment voltage in space-charge limited mode. The ionization grid placed on the top of the crucible was at the same potential as the crucible. The electrons bombard not only the crucible but also the region defined by the grid. When the vapor of metal or metal alloy evaporated from the crucible (the vapor beam) passes through the grid region it is ionized by the electron bombardment. The ionization rate is related directly to the electron bombardment current. The ionization efficiency of the beam may be changed by changing the electron bombardment current and/or changing the size of the grid or the number of elements of the grid. In order to enhance the ion-assisted effect during the deposition, a high ionization efficiency is desirable. Therefore, in the experiments described below the source was operated in a mode very close to the space-charge limited mode to obtain the highest possible ionization. Using aluminum as the source material, typical operation conditions of the source were:

$V_f = 20$ V    $I_f = 10$ A $V_{cru} = 600$ V    $I_{cru} = 600$ mA $V_{ext} = V_{ac} = -3$ kV, where $V_{cru}$ and $I_{cru}$ are as before, $V_f$, $V_{ac}$, and $V_{ext}$ were the voltages applied to the filament, the substrate and the extraction electrode, respectively, and $I_f$ was the current of the electron bombardment filament.

As mentioned above, the ionization efficiency is defined as the ion to atom ratio of the beam. To characterize the ionization source, an experimental measurement of the ionization efficiency was carried out. The ion current collected by the substrate was monitored by the voltage drop across a 10,000 ohm resistor connected to the substrate bias circuit. At the same time the deposition rate on the substrate was measured by a calibrated crystal thickness monitor located very close to the substrate. From the measured ion current $I_i$ and the deposition rate D, the ionization ratio was estimated as $$\alpha = \frac{I_i M}{enSDN_a},$$

e: electron charge,
n: density of source material
S: Area of the substrate
m: gram molecular weight of the source material
$N_a$: Avogadro's number
$I_i$: the measured ion current in mA, and
D: the measured deposition rate in Å/sec.

Using aluminum as the source material, the above equation becomes $\alpha = 0.1\, I_i/D$ for a substrate area of 100 cm².

Figure 5:
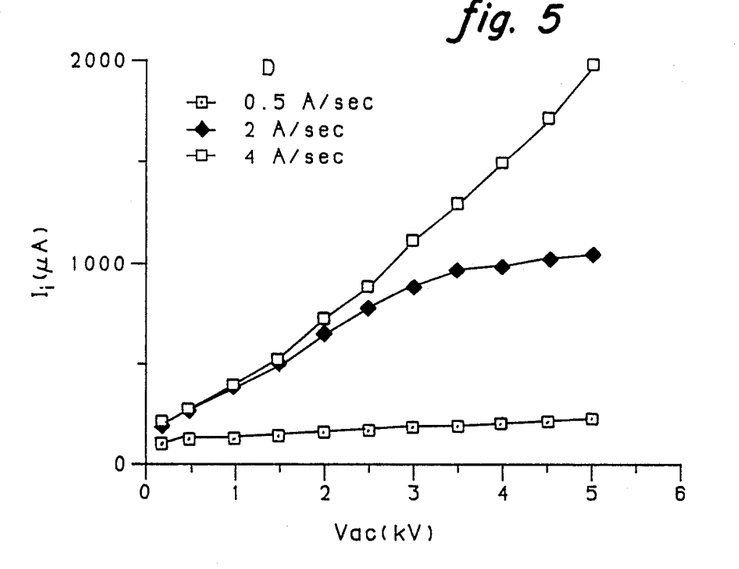
FIG. 5 displays the variation of ion current Ii with substrate bias voltage Vac at various deposition rates D using the ionization source of the invention.
Figure 6:
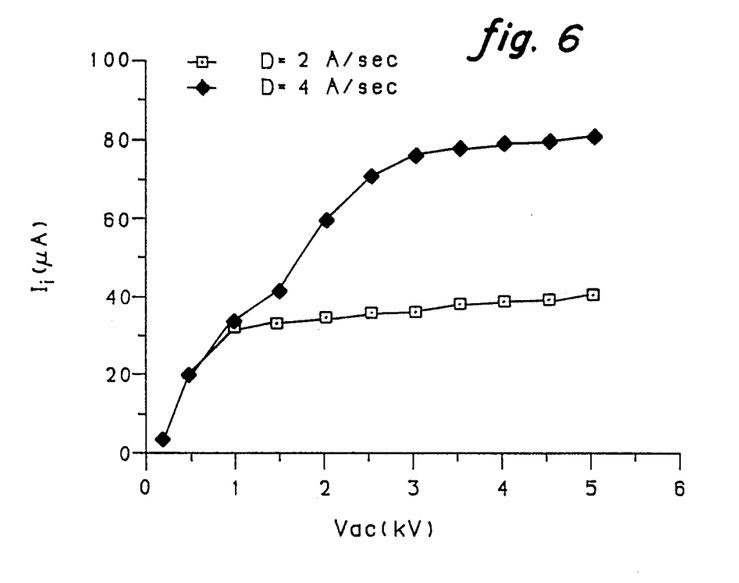
FIG. 6 displays the variation of ion current Ii with substrate bias voltage Vac at various deposition rates D using a conventional ion source.

FIG. 5 summarizes the experimental measurement results of the ion current (Ii) as a function of the bias potential (Vac) when using apparatus of the present invention (FIG. 3) and FIG. 6 when using a conventional ionization source (FIG. 2), respectively. Similar to the mechanism which determines the two operating modes of the electron bombardment heating, here the ion current was limited by the rate at which the ions can be produced (ionization rate) or the rate at which they can be extracted by the applied electric field of the biased substrate. At low deposition rates (less than 1 Å/sec) the beam density is low and the ionization rate is also low. Thus a small ion-current is collected by the substrate as shown in FIG. 5. When the bias potential Vac increases, at a certain point the applied field is strong enough to extract all the ionized species out of the ionization region and the ion current tends to saturate. The saturation current rises with higher deposition rate indicating that the ion current is limited by the ionization rate. When the deposition rate is further increased (more than 4 Å/sec) the ionization rate is correspondingly higher, and a large number of ions are produced. Due to space-charge effects the applied field can no longer draw all of the ions out of the ionization region. Then the ion current is limited by the space-charge effect and follows Child's Law. With the source of the present invention, at high deposition rate the ion current increases with increasing bias potential and shows no sign of saturation even at $V_{ac} = 5$ kV (FIG. 5). In contrast to the ion current profile of the present invention, the ion current generated by a conventional ionization source always saturates at a sufficiently high Vac (FIG. 6). This indicates that the ion current is limited by the ionization rate and that the ionization rate is low in the conventional design of the ionization source.

The improvement in ionization ratio of the apparatus of the invention can be explained by geometrical considerations. A primary difference between the present invention and a conventional design is the location of the ionization region. In the conventional design the ionization region is generally about 5 cm above the crucible while in the present invention the ionization region is located right at the crucible exit. Assuming that the source atoms are ejected out uniformly from the crucible through a solid angle at a constant speed, the mass conservation law shows $$\frac{\rho_R}{\rho_r} = \frac{r^2}{R^2}$$

where $\rho_R$ and $\rho_r$ are the beam densities at distances R and r away from the crucible, respectively. In one form of the present invention, the ionization grid was a helix about 7 mm high. If the ionization region is moved away from the crucible exit to a distance of 5 cm, the beam density will be reduced by a factor of about 50. For comparison, Table I lists the ionization efficiencies as a function of the deposition rate obtained from the present invention and the conventional design.

TABLE I

| Ionization Efficiencies of Ionization Sources | | |
|---|---|---|
| Deposition Rate | Present Invention | Prior Design |
| 0.5 Å/sec | 4.5% | ** |
| 2 Å/sec | 5% | 0.2% |
| 4 Å/sec | 4% | 0.2% |

It can be seen that the ionization efficiency increased by a factor of about 25 (from about 0.2% to 5%), when the ionization region was located about 6 times closer to the crucible.

Figure 7:
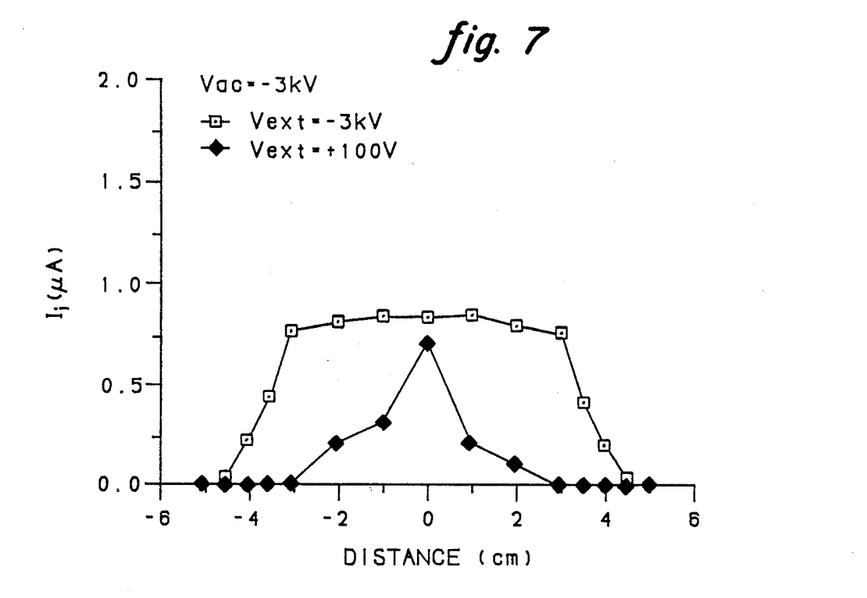
FIG. 7 shows variation of ion current distribution across a substrate surface employing different extraction potentials using the ionization source of the invention.

The uniformity of the ion current across the vapor beam was characterized by measuring the ion current picked up by a Faraday cup which was placed 30 cm above the source in front of the substrate and could be moved across the beam. FIG. 7 shows typical ion current profiles as a function of the position across the beam for an apparatus of the invention. With $V_{ext} = V_{ac} = -3$ kV uniform ion current distribution was obtained over an area 6 cm in diameter at 30 cm from the source. If $V_{ac} = -3$ kV, $V_{ext.} = +100$V, the ion current was focused into a small region. In principle, at a given $V_{ac}$ a uniform distribution of the ion current across the beam can be obtained by applying appropriate $V_{ext}$.

Coating of Substrates with Metal Films

In the process of the present invention, a metal or metal alloy such as aluminum is evaporated in a crucible and partially ionized by electron impact ionization. The ionized species are then accelerated toward the substrate by applying a bias potential to the substrate. It has been found that a bias potential on the substrate of at least 500 volts is needed to control the ion bombardment energy.

The apparatus shown in FIG. 3 was employed to implement the coating process of the present invention. A graphite crucible containing the source material (i.e. aluminum (Al)) was made of high purity graphite. The ionization grid was a tungsten helix supported by the top of the crucible. The heating means and means for generating an electron flux in the vicinity of the ionization grid were a common electron bombardment heating filament. The substrate was placed at a distance of 30 cm from the crucible. The substrate bias potential used in these experiments varied from 1 to 4 kV. In order to maintain the system pressure at about $3 \times 10^{-7}$ Torr (or $4 \times 10^{-5}$ Pa) during the deposition, water cooling was used.

A heating filament located about 1 cm behind (above) the substrate was used to maintain the substrate at the desired temperature by radiation heating during the deposition.

The ionization efficiency was determined as before.

For comparison, via filling experiments were carried out in the same vacuum chamber using the modified conventional exaporation source shown in FIG. 1. All the geometrical factors, such as crucible dimension, deposition area, and crucible to substrate distance, were kept the same as in the system of the invention. A resistance heating method was used to raise the crucible temperature instead of using electron-bombardment heating which might produce ions in the vapor beam. No ions were observed in the vapor beam using this arrangement.

Figure 8:
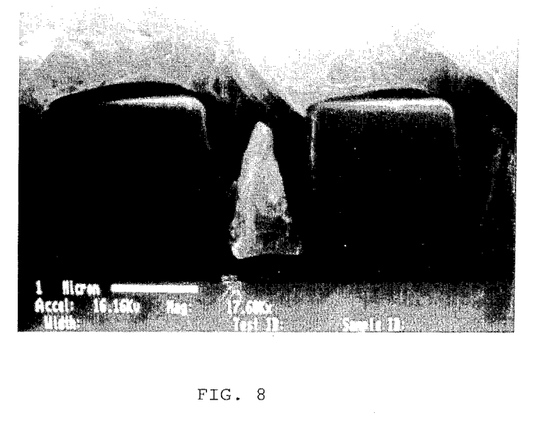
FIG. 8 is a scanning electron microscope (SEM) cross-section picture of an aluminum film deposited on oxide vias by a conventional evaporation process.

FIG. 8 shows a scanning electron microscope (SEM) cross-section picture of an aluminum film deposited on oxide vias at room temperature with a conventional evaporation apparatus. It is obvious that the overhanging structure on the top corners of the vias caused cracks and voids at the bottom corners of the vias. As a result, the conventional process cannot be used to form an electrical contact through the via for multilevel metallization For vias with higher aspect ratio, the situation is worse. In addition to the electrical connection problem, the film is mechanically weak. It exhibits a columnar growth structure which is known to be less dense and brittle. The adhesion of the film on the oxide substrate is also very poor. Very often the aluminum film peels off and leaves a cone-shaped aluminum drop in the via.

Figure 9:
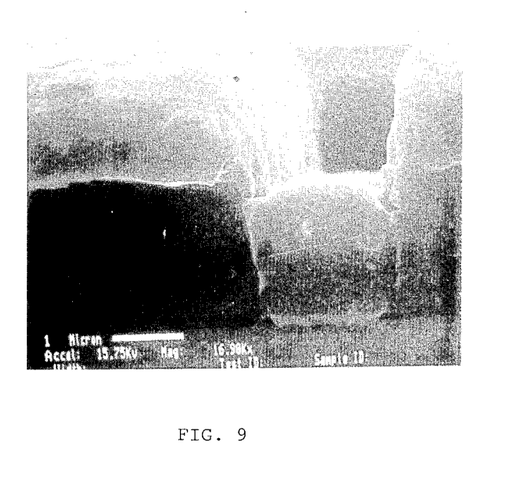
FIG. 9 is an SEM cross-section picture of an aluminum film deposited on oxide vias by a process of the present invention.

In accordance with the present invention, vias exhibiting a high aspect ratio (up to 2) have been filled using an ion to atom ratio of about 1–2%, a bias potential of several kV and a substrate temperature of about 200° C. FIG. 9 shows straight wall oxide vias $2\mu$ deep and $1.5\mu$ wide, covered with $2\mu$ aluminum film applied by the process of the invention. The deposition conditions were:

substrate temperature: $T_s = 210°$ C.,
ion/atom ratio: $\alpha = 1.5\%$,
acceleration voltage: $V_{ac} = 3.8$ kV
deposition rate: $D = 13$ Å/sec.

Figure 10:
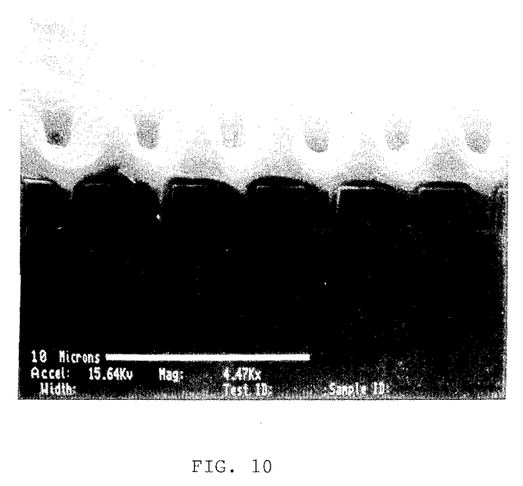
FIG. 10 is an SEM cross-section picture of an aluminum film deposited on a high aspect ratio oxide via by a process of the present invention.

It can be seen that the aluminum layer did not develop an overhang structure over the top corner of the vias during deposition. This allowed filling of the vias without creating cracks at the bottom corners of the vias. The morphology of the aluminum film resembles the original oxide vias, i.e. the sharp rectangular shape has been maintained. FIG. 10 shows $1\mu$ wide and $2\mu$ deep (aspect ratio of 2) vias covered with $2.5\mu$ aluminum film applied by the process of the invention. The deposition conditions were similar to that of FIG. 9 except that the substrate temperature was raised to 260° C. during the deposition of the last $0.5\mu$ aluminum.

The resistivity of the film is $= 2.8\Omega$ cm which is very close to that of bulk aluminum ($2.65\Omega$cm).

In another experiment, straight wall oxide trenches $1\mu$ deep and $1\mu$ wide were covered with $1.8\mu$ aluminum film. The wafer size was two inches. The deposition conditions were:

ion/atom ratio $\alpha = 1.1\%$
acceleration voltage $V_{ac} = 3.5$ kV
deposition rate $D = 13$Å/sec
substrate temperature $T = 150°$ C.

Again the aluminum layer did not develop an overhang structure over the top corner of the trenches during deposition. This allowed the filling of the trenches without creating cracks at the bottom corner of the trenches. The morphology of the aluminum film resembled the original oxide trench, i.e., the sharp rectangular shape was maintained. Below 150° C., cracks were observed. The lower the substrate temperature is the larger the cracks become. As the temperature of the substrate is raised above 150° C. there is a tendency for the surface of the film to become rougher. At substrate temperatures of more than about 200–220° C. the surface roughness begins to become rather pronounced, and at substrate temperatures much in excess of 300° C. the roughness of the surface may be found unsatisfactory for some purposes.

The overhang structure on the top corner of the vias with the aluminum films deposited by conventional means shown in FIG. 8 is initiated by the fact that the deposited film has a tendency to grow in a direction parallel to the local substrate surface, rather than perpendicularly along the direction of incident beam. The shadowing effect which results leads to tapering of the aluminum layer inside the via. Merely changing source dimension without introducing ions into the beam does not avoid void formation in the via.

Figure 11:
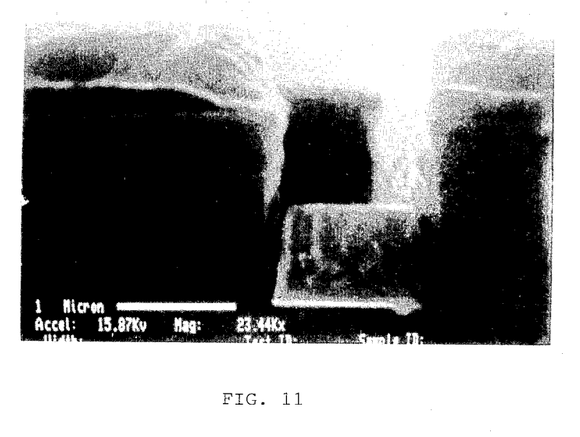
FIG. 11 is an SEM cross-section picture of vias filled with aluminum using the source of the invention at room temperature.
Figure 12:
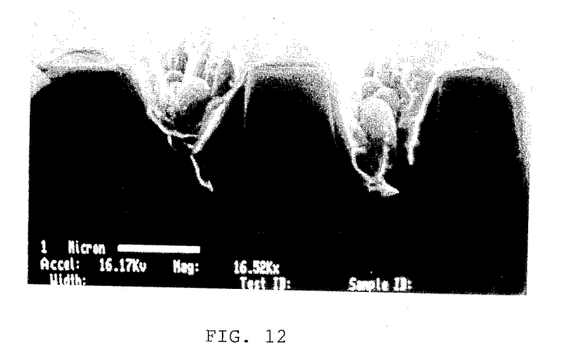
FIG. 12 is an SEM cross-section picture of an aluminum film deposited on oxide vias at 200° C. by a conventional evaporation process.

To achieve a complete via filling, ion bombardment is essential. However, with the range of ion-to-atom ratio obtainable by the process of the present invention moderate substrate heating is still necessary. FIGS. 11 and 12 show the separate effects of ion bombardment and substrate temperature.

The micrograph shown in FIG. 11 was taken from a sample deposited using the apparatus and process of the present invention but at room temperature (no intentional substrate heating). By comparing FIG. 11 with FIG. 8 two major structural changes can be seen to have been induced by ion bombardment. First, the overhang on the top corners of the via is greatly reduced, which is believed to be a result of simultaneous ion milling during the deposition. The incident aluminum atoms were constantly able to reach the bottom of the via and the film thickness inside the via is the same as that at the top of the via (except for a very narrow region right next to the via side walls). Second, the film deposited by the process of the invention does not show columnar growth and has a very good adhesion to the oxide substrate. Because of the ion bombardment during deposition, a layer (about a few hundred Å in thickness) near the surface of the film may be heated up substantially. This heating is believed to cause interface mixing at the early stage of the film formation and atomic rearrangement in the film during growth. The former improves adhesion and the latter can break the columnar structure. However, it is seen in FIG. 11 that the use of the process of the invention without substrate heating still left very narrow cracks at the edges of the via. Narrow aluminum contacts could be fabricated in this way by using a lift-off metallization technique.

The sample shown in FIG. 12 was deposited by the conventional evaporation technique using the apparatus of FIG. 1 at 200° C. substrate temperature without the use of ions. It is obvious that substantial surface diffusion took place at that temperature. This diffusion caused more material to flow into the via and, consequently, the film around the via became semi-conformal. For this kind of semi-conformal growth mode, a void is very likely to be formed near the center of the via. It is also seen that the film has a much rougher surface.

However, with the assistance of this surface diffusion caused by heating the substrate to about 200° C. during the PIB deposition, the narrow cracks which appeared in what is seen in FIG. 11, were healed as shown in FIG. 9. It is also very important to notice that, unlike what is seen in FIG. 12, the film deposited by the process of the present invention with a substrate temperature of about 200° C. retained a smooth surface. The process of the present invention has also been used to deposit thick (4μ) smooth aluminum lines for wafer scale integration which cannot be obtained by conventional means.

Figure 13:
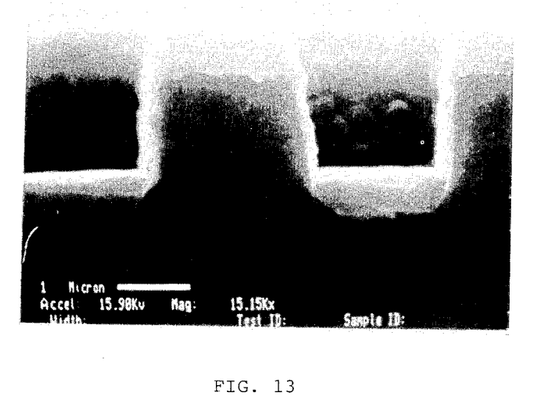
FIG. 13 is an SEM cross-section picture of the initial stage of via filling using a process of the present invention.

It should be mentioned that the mechanism of via filling using the process of the present invention is rather different from that of the bias sputtering process. In the bias sputtering process coverage of steps is conformal from the beginning of deposition. In the present invention, the initial deposition is completely non-conformal as shown in FIG. 13. Very little coating is found on the side walls. Without the shadowing effect caused by the overhang structure, the vias can be filled up layer-by-layer from the bottom.

The ion percentages, ion energies and substrate temperatures used to obtain complete via filling herein may be varied to obtain an the optimum combination within the scope of the invention. Higher ion-to-atom ratios may further reduce the minimum temperature required for complete via filling. Variation of ion energy in the range of 2 keV to 5 keV has not been found to change the via filling result in a significant manner.

Planarization

Figure 14:
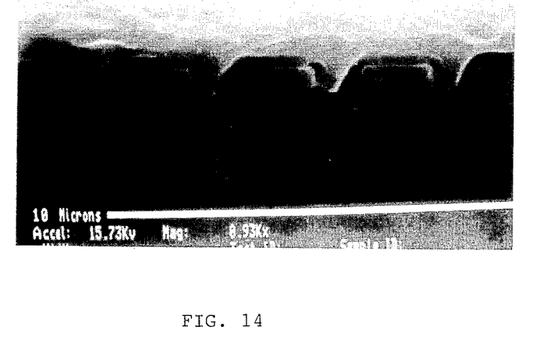
FIG. 14 is an SEM cross-section picture of a surface planarized according to the present invention.

After a via or trench is filled the aluminum layer may be made substantially level or planarized by continuing deposition of the aluminum at a higher substrate temperature. FIG. 14 shows a planarized aluminum layer on 1μ×1μ oxide trenches. The film was deposited at 150° C. for the first 1μ and then the substrate temperature was gradually raised to 300° C. by means of the substrate heater during deposition of an additional 1μ. The deposition was continued while the temperature was being increased. When deposition was stopped the substrate temperature was 300° C. The total thickness of the aluminum film was therefore 2μ. With the two-step deposition the film was planarized with a certain degree of surface roughness. The slightly darker regions at some of the corners of the trenches are artifacts caused by cutting and back-etching of the wafer for the SEM study. The trenches were actually filled wall to wall.

Figure 15:
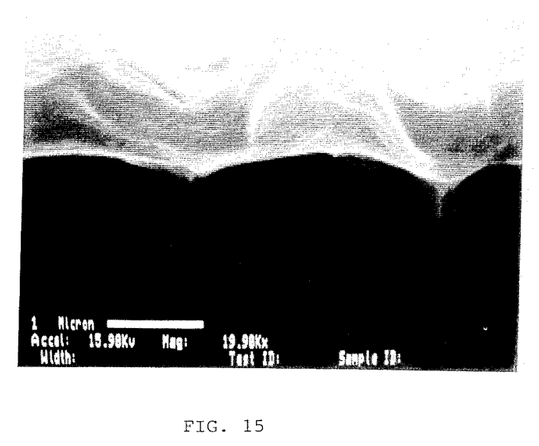
FIG. 15 is an SEM cross-section picture of an aluminum film deposited on oxide vias at 200° C. according to the present invention.
Figure 16:
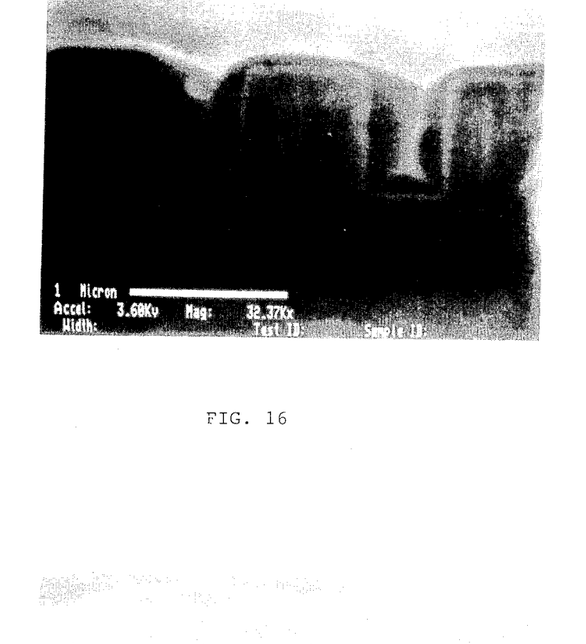
FIG. 16 is an SEM cross-section picture of an aluminum film deposited on oxide vias at 230° C.
Figure 17:
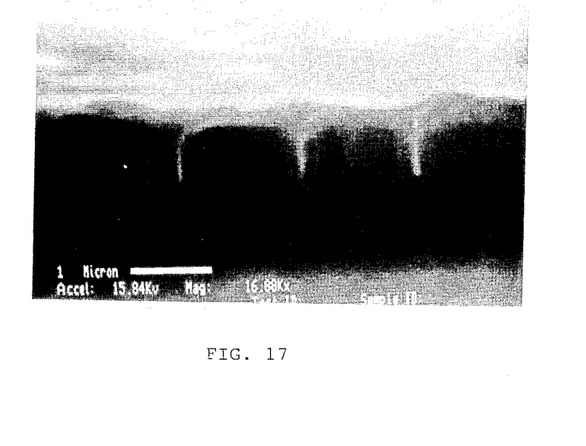
FIG. 17 is an SEM cross-section picture of an aluminum film deposited on vias at 300° C.

As the temperature used for initially filling the via or trench is increased from about 150°, the aluminum surface tends to be rougher. FIGS. 15, 16 and 17 were aluminum films deposited in one step at constant substrate temperatures of 200° C., 230° C., and 300° C. respectively. The trench in FIG. 15 was 1μ deep and 1μ wide. The trenches in FIGS. 16 and 17 were 1μ deep and ½μ wide (aspect ratio =2). The other deposition conditions were:

| FIG. 15 | FIG. 16 | FIG. 17 |
| --- | --- | --- |
| $\alpha = 1.7\%$ | $\alpha = 2.4\%$ | $\alpha = 2.3\%$ |
| $V_{ac} = 3.6$ kV | $V_{ac} = 3.6$ kV | $V_{ac} = 3.3$ kV |
| $D = 14$ Å/sec | $D = 16$ Å/sec | $D = 15$ Å/sec. |
| $t = 1.4 \mu$ | $t = 1.4 \mu$ | $t = 1.4 \mu$ | where $t$ is the thickness of the Al film. All these cases show very good trench filling, but the surface is seen to be rougher as the substrate temperature is increased. For the case of 300° C. deposition, massive flow of Al occurred during deposition, and the film was locally planarized but the surface was quite rough.

If the deposition is performed at 300° C. with no ions in the beam, i.e., a conventional deposition technique, then a discontinuous Al film (extremely rough) will be found with a (columnar) structure of three-dimensional islands. Via/trench filling would not be possible in this case. This is quite different from the result of deposition by the process of the invention. Not only is it possible to completely fill vias or trenches by the process of the invention, the surface is a continuous film even though the surface is still quite rough. Comparing FIG. 13 and FIG. 16, it is apparent that the two-step planarization at different temperatures according to the present invention is superior to one-step planarization at a fixed temperature. The surface roughness resulting from two-step planarization is less and the variations in thickness are localized. One-step deposition gives greater long-range variations in thickness. It is also important to point out that in order to have a complete planarization, the thickness of the film deposited in the second step (150° C.–300° C.) of the two step deposition scheme should not be less than the original depth of the via; otherwise only a partial planarization can be achieved. The ion percentage in the beam should be higher than 0.7% in order to give significant ion bombardment effect. Variation of ion energy in the range of 2–5 Kev has not been found to change the planarization result in a visible manner.

All the films mentioned above were deposited on 2" wafers. The via or trench filling and planarization were uniformly gOod from the center to the edge of the wafers which were tilted in such a way that the incoming beam made an angle Θ with respect to the normal of the wafer surface. When the substrate temperature was set at 150° C., no shadowing effects were observed when the tilted angle Θ was not more than about 8°. Only trenches with aspect ratio equal to 1 were tested in this manner. It is believed that with a source to wafer distance of about 30cm the largest wafer size in which one can obtain a reliable coating on the entire wafer is 3" if the normal of the surface of the wafer is set parallel to the beam. For larger wafers, to secure complete coverage it is necessary to set the wafer at a greater distance or to use multiple sources for uniform and reliable coating on the entire wafer. For example, for complete coverage a 6" wafer must be set about 60 cm away from the source.

In the embodiments of the invention described herein, a new ionization source and apparatus for generating a partially ionized beam of metal vapor have been described. In this source an ionization grid is directly adjacent to the source of metal vapor in the area of maximum vapor density. This arrangement provides much higher ionization efficiencies of up to about 5% ion/atom ratio than possible heretofore. This higher ion/atom ratio in combination with a bias potential on a substrate heated to at least about 150° C. for the first time affords a process for non-conformally coating stepped surfaces such as high aspect ratio vias and trenches. The metal contacts formed in vias and trenches by the process of the invention have excellent adhesion and conductivity ensuring the good electrical connections required for VLSI chips. Continuing operation of the process when the temperature of the substrate has been raised to at least about 250° C. forms a substantially planarized surface suitable for further processing.

Accordingly, while various preferred embodiments of the invention are described herein, it will be obvious to those skilled in the art that various changes and modifications may be made therein within the scope of the invention.

What is claimed is:

1. A process for coating a stepped surface of a substrate with a metal or metal alloy comprising:
    (a) vaporizing the metal or metal alloy,
    (b) partially ionizing the vapor to an ion/atom ratio of from about 0.7% to about 5%,
    (c) applying a bias potential of at least 500 volts to the substrate to draw the partially ionized vapor to the substrate, and
    (d) maintaining the substrate at a temperature of at least about 150° C. until a desired amount of the metal or metal alloy has been deposited on the surface.

2. The process of claim 1 wherein the stepped surface comprises a via.

3. The process of claim 1 wherein the stepped surface comprises a trench.

4. The process according to claim 1 wherein the metal or metal alloy comprises aluminum.

5. The process according to claim 1 wherein the bias potential is from about 1 kilovolt to about 5 kilovolts, the stepped surface comprises a via having a depth at least as great as its width, and the process fills the via from wall-to-wall.

6. The process of claim 1 wherein the metal or metal alloy is vaporized from an open top crucible, and wherein the step of partially ionizing the vapor comprises:
    creating a flux of electrons in a region of maximum vapor density directly adjacent the open top of the crucible.

7. The process of claim 6 wherein the step of creating a flux of electrons comprises locating an ionization grid on a supporting surface at the top of said crucible.

8. The process of claim 7 wherein the metal or metal alloy is vaporized and the flux of electrons is created using a common electron bombardment filament.

9. A process for coating a stepped surface of a substrate with a metal or metal alloy to form a planarized surface comprising:
    (a) vaporizing the metal or metal alloy,
    (b) partially ionizing the vapor to an ion/atom ratio of from about 0.7% to about 5%,
    (c) applying a bias potential of at least 500 volts to the substrate to draw the partially ionized vapor to the substrate, and
    (d) maintaining the substrate at a temperature of at least about 250° C. and not more than about 350° C. until a layer of the metal or metal alloy having a thickness at least as great as the highest step of said surface has been deposited on the surface.

10. The process according to claim 6 wherein the bias potential is from about 1 kilovolt to about 5 kilovolts.

11. A process for filling a via on a surface of a substrate with a metal or metal alloy and then planarizing the resulting surface with the metal or metal alloy comprising:
    (a) vaporizing the metal or metal alloy,
    (b) partially ionizing the vapor to an ion/atom ratio of from about 0.7% to about 5%,
    (c) applying a bias potential of at least 500 volts to the substrate to draw the partially ionized vapor to the substrate and into the via, and
    (d) maintaining the substrate at a temperature of at least about 150° C. and not more than about 200° C. until the via is substantially filled, and then
    (e) increasing the temperature of the substrate to at least about 250° C. and not more than about 350° C. while continuing steps (a), (b) and (c) until a layer of the metal or metal alloy having a thickness at least as great as the original depth of the via has been deposited on the surface.

12. The process according to claim 11 wherein the metal or metal alloy comprises aluminum.

13. The process according to claim 11 wherein the bias potential is from about 1 kilovolt to about 5 kilovolts, the stepped surfaces comprises a via having a depth at least as great as its width, and the process fills the via from wall-to-wall.

14. A method for generating a beam comprising self-ions of a metal or metal alloy comprising:
    vaporizing the metal or metal alloy from an open top crucible such that adiabatic expansion of vapor as it exits from the open top of the crucible does not occur;
    creating a flux of electrons in a region of maximum vapor density directly adjacent the open top of the crucible; and
    passing the vapor as it exits from the crucible through the electron flux directly adjacent the open top of the crucible to create a beam of self-ions having an ion/atom ratio of from about 0.7% to about 5%.

15. The method of claim 14 wherein the step of creating a flux of electrons comprises attaching multiple removable ionization grid elements to a surface at the top of the crucible, and further comprising the step of adjusting said flux by varying the number of such elements attached to said surface.

16. The method of claim 15 wherein the metal or metal alloy is vaporized and the flux of electrons is created using a common electron bombardment filament.

* * * * *

UNITED STATES PATENT AND TRADEMARK OFFICE
CERTIFICATE OF CORRECTION

PATENT NO. : 4,944,961

DATED : July 31, 1990

INVENTOR(S) : Lu et al.

It is certified that error appears in the above-identified patent and that said Letters Patent is hereby corrected as shown below:

Column 14, claim 10, should read --The process according to claim 9 wherein the bias potential is from about 1 kilovolt to about 5 kilovolts.

Signed and Sealed this

Twenty-fourth Day of November, 1992

Attest:

DOUGLAS B. COMER

*Attesting Officer*

Acting Commissioner of Patents and Trademarks